(12) United States Patent
Jeong et al.

(10) Patent No.: US 7,972,886 B2
(45) Date of Patent: Jul. 5, 2011

(54) METHOD OF MANUFACTURING MICRO ELECTRO MECHANICAL SYSTEMS DEVICE

(75) Inventors: Heewon Jeong, Tokyo (JP); Yasushi Goto, Kokubunji (JP); Yuko Hanaoka, Kodaira (JP); Tsukasa Fujimori, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 407 days.

(21) Appl. No.: 12/143,372

(22) Filed: Jun. 20, 2008

(65) Prior Publication Data
US 2009/0017579 A1   Jan. 15, 2009

(30) Foreign Application Priority Data
Jul. 12, 2007 (JP) ................................. 2007-183159

(51) Int. Cl.
*H01L 21/00* (2006.01)

(52) U.S. Cl. ............. 438/50; 438/48; 438/52; 310/329; 73/488; 73/514.01; 257/E21.022; 257/E21.573; 257/E23.193

(58) Field of Classification Search .................. 438/106, 438/48, 50; 359/578, 579, 585, 587, 589; 385/18, 19; 310/329; 73/488, 514.01; 257/E21.022, 257/E21.573, E23.193
See application file for complete search history.

(56) References Cited

U.S. PATENT DOCUMENTS

| | | | |
|---|---|---|---|
| 5,155,061 A * | 10/1992 | O'Connor et al. | 438/53 |
| 6,300,676 B1 * | 10/2001 | Kawai | 257/678 |
| 6,391,742 B2 * | 5/2002 | Kawai | 438/456 |
| 6,933,163 B2 * | 8/2005 | Yun et al. | 438/48 |
| 6,964,882 B2 * | 11/2005 | Yun et al. | 438/108 |
| 7,019,364 B1 * | 3/2006 | Sato et al. | 257/347 |
| 7,078,293 B2 | 7/2006 | Lin et al. | |
| 7,235,456 B2 | 6/2007 | Sato et al. | |
| 7,301,703 B2 * | 11/2007 | Nakamura et al. | 359/578 |
| 7,304,800 B2 * | 12/2007 | Nakamura et al. | 359/579 |
| 2006/0257070 A1 | 11/2006 | Lin et al. | |

FOREIGN PATENT DOCUMENTS

| | | |
|---|---|---|
| JP | 10-178181 A | 6/1998 |
| JP | 2001-004658 A | 1/2001 |
| JP | 2001-144276 A | 5/2001 |
| JP | 2004-127871 A | 4/2004 |
| JP | 2004-354977 A | 12/2004 |
| JP | 2005-165067 A | 6/2005 |

(Continued)

OTHER PUBLICATIONS

Mizushima et al., "Empty-space-in-silicon technique for fabricating a silicon-on-nothing structure", Applied Physics Letters, vol. 77, No. 20, 2000, pp. 3290-3292.

(Continued)

*Primary Examiner* — Thao X Le
*Assistant Examiner* — Eric W Jones
(74) *Attorney, Agent, or Firm* — Miles & Stockbridge P.C.

(57) ABSTRACT

Provided is a MEMS device which is robust to the misalignment and does not require the double-side wafer processing in the manufacture of a MEMS device such as an angular velocity sensor, an acceleration sensor, a combined sensor or a micromirror. After preparing a substrate having a space therein, holes are formed in a device layer at positions where fixed components such as a fixing portion, a terminal portion and a base that are fixed to a supporting substrate are to be formed, and the holes are filled with a fixing material so that the fixing material reaches the supporting substrate, thereby fixing the device layer around the holes to the supporting substrate.

5 Claims, 9 Drawing Sheets

FOREIGN PATENT DOCUMENTS

| | | |
|---|---|---|
| JP | 2006-023606 A | 1/2006 |
| JP | 2006-051549 A | 2/2006 |
| JP | 2007-069341 A | 3/2007 |

OTHER PUBLICATIONS

Kageyama et al., "Polycrystalline silicon thin films with hydrofluoric acid permeability for underlying oxide etching and vacuum encapsulation" Journal of Vacuum Science and Technology A 18(4), 2000, pp. 1853-1858.
Counterpart Japanese Office Action.
English translation of Figs. 5, 7-9, 10, and 11(a) of JP A 2006-023606.
English translation of Paragraph 0026 of JP A 2005-165067.
English translation of Paragraph 0058 of JP A 2007-069341.
English translation of Fig. 9 of JP A 2004-127871.

* cited by examiner

METHOD OF MANUFACTURING MICRO ELECTRO MECHANICAL SYSTEMS DEVICE

CROSS-REFERENCE TO RELATED APPLICATION

The present application claims priority from Japanese Patent Application No. JP 2007-183159 filed on Jul. 12, 2007, the content of which is hereby incorporated by reference into this application.

TECHNICAL FIELD OF THE INVENTION

The present invention relates to a technology for manufacturing a Micro Electro Mechanical Systems (MEMS) device having a movable portion or a suspension portion such as an acceleration sensor, an angular velocity sensor, a resonator, a mechanical filter, or a micromirror. In particular, it relates to a technology for manufacturing a hermetically-sealed MEMS device which exchanges electric signals with the outside.

BACKGROUND OF THE INVENTION

For example, a MEMS device having a supporting member formed of a silicon substrate, a fixing portion formed on the supporting member, and a flat plate-shaped movable portion provided with interposing a space between the movable portion and the supporting member, in which the fixing portion supports the movable portion via a beam, has been suggested. This MEMS device detects a displacement of the movable portion as a change of a capacitance value.

In the method of forming the MEMS device, the space of the MEMS device is formed by removing a sacrificial layer provided between the supporting member and the movable portion and beam, and a cavity in a cavity layer formed by the removal corresponds to the space. However, in the course of the manufacturing process or during use of the product, a sticking phenomenon in which the beam comes into contact with the supporting member occurs in some cases. Thus, in the semiconductor sensor and the manufacturing method thereof already known to the public based on the specification of Japanese Patent Application Laid-Open Publication No. 2001-4658 (Patent Document 1), a silicon wafer (silicon substrate) having a concave portion formed thereon is first attached onto a glass substrate serving as a supporting member, thereby forming a cavity layer. Then, the silicon wafer is subjected to anisotropic etching to form functional portions such as a fixing portion, a beam, and a movable portion. Therefore, since the etching of a sacrificial layer is not required, the occurrence of the sticking phenomenon can be reduced.

Also, in the method of manufacturing a MEMS device already known to the public based on the specification of Japanese Patent Application Laid-Open Publication No. 10-178181 (Patent Document 2), a concave portion is first formed on a glass substrate. Then, a silicon wafer (silicon substrate) having an oxide film on one surface thereof and a nickel film to be used as a mask in silicon etching on the other surface thereof is fabricated. Thereafter, the nickel mask is patterned and the silicon wafer is subjected to anisotropic etching with using the nickel film as a mask, thereby forming a movable portion. At this time, the oxide film formed on the opposite surface is used as an etch stop layer. After the anisotropic etching to the silicon wafer, the nickel layer used as the mask is removed from the silicon wafer, and then the silicon wafer is anodically-bonded to the glass substrate. Thereafter, the oxide film on the surface of the silicon wafer is removed.

Note that, in the MEMS device, as introduced in the Patent Documents 1 and 2, an SON (Silicon On Nothing) wafer (SON substrate) is used. As an example of the manufacturing method thereof, the SON wafer can be formed by bonding a flat wafer (glass substrate) onto one silicon wafer (silicon substrate) having a concave portion formed thereon. Further, other than these methods, the SON wafer can be fabricated by the manufacturing methods introduced in Applied Physics Letters, Vol. 77, No. 20, 2000, pp. 3290-3292 (Non-Patent Document 1) and Journal of Vacuum Science and Technology A 18(4), 2000, pp. 1853-1858 (Non-Patent Document 2). The Non-Patent Document 1 introduces a process of forming a space (cavity) by deeply digging a micro-hole on the order of sub-microns in the surface of a silicon wafer and then performing hydrogen-annealing. Also, although the Non-Patent Document 2 does not describe a method of manufacturing a SON wafer, it describes a process that can be applied to the SON manufacture as it is.

SUMMARY OF THE INVENTION

In the technology described in the Patent Document 1, a cavity layer is formed in advance in a silicon wafer, and the anisotropic etching is performed from the rear surface of a cavity-layer formation surface. Therefore, when forming the cavity layer, it is required to form an island-shaped bank portion in advance at a position corresponding to a fixing portion formed in a latter process, and double-side processing of the silicon wafer is inevitable.

A MEMS device using such a technology as described in the Patent Document 2 studied by the inventors of the present invention is shown in FIG. 14. Note that a reference numeral 100 denotes a supporting member, 101 denotes a fixing portion, 102 denotes a bank portion, 103 denotes a movable portion, 104 denotes a cavity layer and 105 denotes a beam, respectively.

In order to bond a silicon wafer which has been subjected to anisotropic etching onto the supporting member 100 having a concave portion formed thereon and to suspend the movable portion 103 formed on the silicon wafer, the bank portions 102 have to be formed on the supporting member 10 side, and the size thereof has to be determined in consideration of an error in alignment. However, if the silicon wafer has a large diameter, a large angle error in alignment sometimes causes a misalignment between the bank portion 102 formed on the supporting member 100 and the fixing portion 101 formed on the silicon wafer. More specifically, the length of the fixing portion 101 to be bonded onto the supporting member 100 and the length of the beam 105 connecting this fixing portion 101 and the movable portion 103 do not match in some cases. In this case, deterioration in performance such as deterioration in resonance frequency of the sensor and occurrence of unwanted mode may occur. Moreover, since variations in performance between sensors are caused, manufacturing yield is deteriorated.

Also, in the technology as described in the Patent Document 2, since the silicon wafer to which anisotropic processing has been completed is bonded onto the supporting member formed of a glass substrate, breakage of the movable portion occurs at the time of bonding. Moreover, since the oxide film formed on the front surface is removed with etchant after the bonding, in a sensor having a small-sized movable toothed gear or fixing pattern such as a fixed toothed gear, the movable portion may possibly be stuck to the surrounding fixed pattern (in particular, the movable toothed gear and the fixed toothed pattern together).

An object of the present invention is to provide a MEMS device which is robust to the misalignment and does not require the double-side wafer processing in the manufacture of a MEMS device such as an angular velocity sensor, an acceleration sensor, a combined sensor (sensor in which an angular velocity sensor and an acceleration sensor are integrated together), or a micromirror.

The above and other objects and novel characteristics of the present invention will be apparent from the description of this specification and the accompanying drawings.

The typical ones of the inventions disclosed in this application will be briefly described as follows.

In a method of manufacturing a MEMS device according to the present invention, first, (a) a substrate that includes a supporting member and a conductor provided with interposing a space between the conductor and the supporting member and that has a first planar area and a second planar area in contact with the first planar area is prepared. Then, (b) a hole penetrating in a thickness direction of the substrate is formed in the conductor in the second planar area. Then, (c) a fixing material is provided through the hole to be deposited on the supporting member and further the hole is filled with the fixing material, thereby fixing the supporting member and the conductor in the second planar area with the fixing material. Then, (d) the conductor is patterned, thereby forming a fixing portion from the conductor in the second planar area and forming a movable portion and a beam, which connects the movable portion and the fixing portion, from the conductor in the first planar area.

The effects obtained by typical aspects of the present invention will be briefly described below.

According to the method of manufacturing a MEMS device of the present invention, a substrate having a space formed therein is used, micro-holes are formed at necessary portions, and the holes are filled with a fixing material to fix surrounding portions of the holes to the supporting member. Therefore, different from the technology described in the Patent Document 1, the double-side processing for the wafer is not required. Also, since it is not required to know in advance the position where the fixing portion is to be placed when forming the space, a large amount of standard substrates (wafers) having a space can be produced. Furthermore, since a movable portion and a fixing portion are formed after the substrate (wafer) formed of a conductor and the substrate (wafer) to be a supporting member are bonded together, highly accurate alignment is not required. As a result, high-performance and highly reliable MEMS devices with little individual difference between devices can be manufactured.

BRIEF DESCRIPTIONS OF THE DRAWINGS

DESCRIPTIONS OF THE PREFERRED EMBODIMENT

Figure 1:
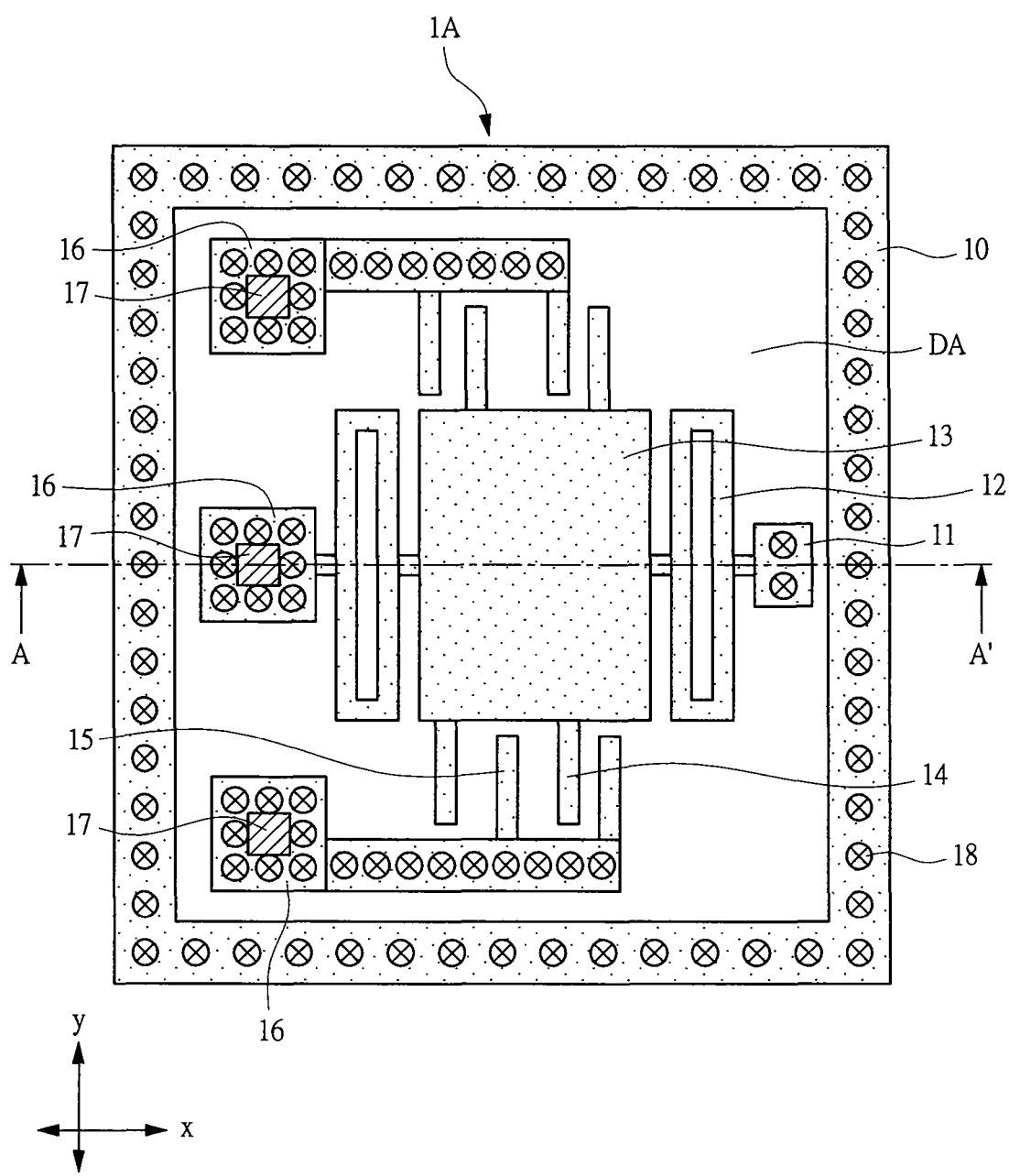
FIG. 1 is a plan view of the configuration of a MEMS device according to an embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, components having the same function are denoted by the same reference symbols throughout the drawings for describing the embodiments, and the repetitive description thereof is omitted. Also, in the drawings used in the embodiments, hatching is used in some cases even in a plan view so as to make the drawings easy to see.

A Micro Electro Mechanical Systems device (hereinafter, referred to as a MEMS device) according to a present embodiment will be described with reference to the drawings. In the description of the present embodiment, an acceleration sensor is taken as an example of the MEMS device.

Figure 2:
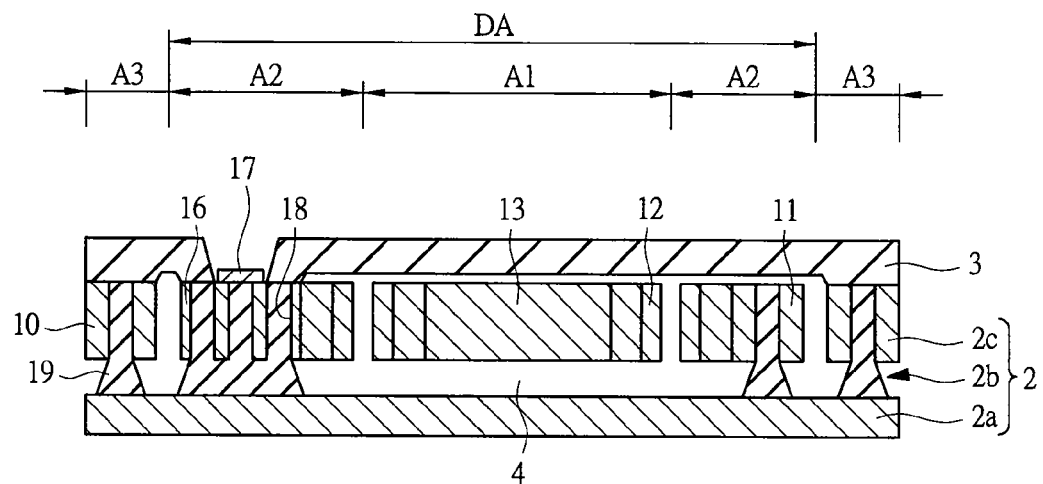
FIG. 2 is a cross-sectional view of the MEMS device taken along the line A-A' in FIG. 1.

First, the structure of an acceleration sensor 1A according to the present embodiment will be described with reference to FIG. 1 and FIG. 2. FIG. 1 is a plan view of main components of the acceleration sensor according to the present embodiment. FIG. 2 is a cross-sectional view of the acceleration sensor taken along the line A-A' in FIG. 1.

For the acceleration sensor 1A, a substrate 2 having a space 4 is used. In the substrate 2 having the space 4, a space layer 2b is formed by forming a concave portion (space 4) on a supporting substrate 2a of a supporting member by the use of photolithography and etching, and then a device layer 2c formed of a conductor is bonded thereto. After the bonding, the thickness of the device layer 2c is adjusted by polishing or dry etching using plasma.

In the present application, a layer having the space 4 and placed on the supporting substrate 2a constituting a substrate 2 is taken as the space layer 2b. Also, a layer on which main components of the acceleration sensor 1A are formed and placed on the space layer 2b is taken as the device layer 2c. In other words, the space layer 2b is formed on the supporting substrate 2a, and the device layer 2c is formed on the space layer 2b. By processing this device layer 2c, a base 10 is formed so as to surround a device formation area DA, and components described further below are formed inside the base 10. Note that FIG. 2 shows an area A1 included in the device formation area DA and having a movable portion 13 formed therein and an area A2 in contact with the area A1 and having components such as a fixing portion 11 and a terminal portion 16 fixed to the supporting substrate 2a formed therein. Further, FIG. 2 also shows an area A3 surrounding the device formation area DA and having the base 10 formed therein.

The supporting substrate 2a is formed of, for example, a silicon (Si) substrate, and the device layer 2c is formed of, for example, a conductive silicon substrate. The supporting substrate 2a has a thickness of, for example, several tens to several hundreds μm, the space layer 2b has a thickness of, for example, several hundreds nm to several μm, and the device layer 2c has a thickness of, for example, several hundreds nm to several tens μm. Note that, although a silicon substrate (semiconductor substrate) is used for the substrate 2 having the space 4 in the present embodiment, this is not meant to be restrictive, and various modifications can be made. For example, conductive polysilicon using surface MEMS technology or plated metal such as nickel (Ni) may be used for the device layer 2c.

Also, as will be described further below, components fixed to the supporting substrate 2a such as the base 10 are adhered and fixed to the supporting substrate 2a by filling the holes 18 formed in advance with a fixing material 19 so that the fixing material 19 reaches the supporting substrate 2a.

As shown in FIG. 1, in the device formation area DA surrounded by the base 10, the fixing portion 11 is formed by patterning the device layer 2c. This fixing portion 11 is fixed to the supporting substrate 2a via the fixing material 19 in the space layer 2b. Further, a beam 12 supporting the movable portion 13 to be described later is connected to this fixing portion 11. The movable portion 13 is formed by patterning the device layer 2c. Since this movable portion 13 is supported by the beam 12 and the space 4 is formed below the movable portion 13, the movable portion 13 is separated from the supporting substrate 2a and is suspended on the fixing portion 11.

Since a movable electrode 14 is fixed (connected) to only the movable portion 13, it moves in the same manner as that of the movable portion 13. The fixed electrode 15 is disposed so as to face the movable electrode 14 and is fixed to the supporting substrate 2a via the fixing material 19 of the space layer 2b. A capacitance is formed between the fixed electrode 15 and the movable electrode 14. When acceleration is applied to displace the movable portion 13 and the movable electrodes 14, the capacitance is also changed. A detection circuit for detecting the change will be described further below with reference to FIG. 3.

The terminal portion 16 is connected to the fixed electrode 15 and is fixed to the supporting substrate 2a via the fixing material 19 of the space layer 2b. Also, an electrode pad 17 formed of a metal film made of Al is formed on the terminal portion 16, and electric signals are exchanged with the outside.

As described above, fixed components formed on the device layer 2c such as the base 10, the fixing portion 11, the fixed electrodes 15 and the terminal portion 16 are fixed to the supporting substrate 2a via the underlying space layer 2b by filling the holes 18 formed in advance with the fixing material 19 so that the fixing material 19 reaches the supporting substrate 2a. On the other hand, movable components such as the beam 12, the movable portion 13 and the movable electrodes 14 are in a state of being suspended on the fixing portion 11 because the space 4 is formed therebelow. Thus, the movable components are configured to move within a plane of the device layer 2c parallel to a main surface of the substrate 2 having the space 4.

As shown in FIG. 2, a cap 3 is bonded onto the base 10, and this cap 3 is disposed so as to cover the device formation area DA of the acceleration sensor 1A. This cap 3 is formed of, for example, a glass substrate and is bonded onto the base 10 made of silicon by anodic bonding. Furthermore, an opening is formed in this cap 3 at the position to which the electrode pad 17 is bonded, and electrical signals can be exchanged with the outside of the device by such means as wire bonding.

Here, the features of the present invention will be described. First, as shown in FIG. 2, one feature of the present invention lies in a method of fixing such fixed components as the base 10, the fixing portion 11, the fixed electrodes 15 and the terminal portion 16 by the use of the substrate 2 having the space 4. As will be described further below, the holes 18 are formed in these components in advance, and by filling the holes 18 with the fixing material 19 so that the fixing material 19 reaches the supporting substrate 2a, the fixed components are adhered to the supporting substrate 2a via the space layer 2b. More specifically, since the portions where the holes 18 are formed are fixed, at the time of manufacturing the wafer (disk-shaped substrate 2) having the space 4, no particular consideration is required for a position of a pattern to be formed later. Therefore, as studied by the inventors of the present invention, the double-side processing on the wafer and the highly accurate bonding alignment are not required.

Also, although the space layer 2b is present below the device layer 2c where sensor components such as the movable portion 13 and the beam 12 are formed, for example, the movable portion 13 can be released only by patterning the device layer 2c. Therefore, it becomes unnecessary to perform an etch-hole forming process for floating the movable portion and a releasing process for removing the insulator below the movable portion, which are indispensable in the manufacturing method using a Silicon On Insulation (SOI) substrate in which an insulating layer is present between the device layer 2c and the supporting substrate 2a. Accordingly, the mass per unit area can be increased, and the downsizing and the performance improvement of the sensor can be achieved.

Another feature of the present invention lies in the fixing portion 11. The fixing portion 11 is fixed to the supporting substrate 2a via the space layer 2b by filling the holes 18 with the fixing material 19 so that the fixing material 19 reaches the supporting substrate 2a. Thereafter, the device layer 2c formed around the holes 18 is patterned to form the fixing portion 11. Therefore, the fixing material 19 which is formed below the fixing portion 11 and fixes the fixing portion 11 to the supporting substrate 2a via the space layer 2b is inevitably formed inside the fixing portion 11, and it does not protrude from (reach) the fixing portion 11. In other words, the fixing material 19 is provided through the holes 18 to be deposited on the supporting substrate 2a so as not to protrude below the beam 12 adjacent to the fixing portion 11. Therefore, the beam 12 connected to the fixing portion 11 to support the movable portion 13 can be formed to have dimensions as designed without requiring highly-accurate alignment. As a result, high-performance sensors with less deviation in resonance frequency and less occurrence of unwanted mode can be achieved and individual difference between devices can be reduced. Thus, high-performance acceleration sensors can be achieved with high yield.

Next, the operation of the acceleration sensor 1A according to the present embodiment will be described. In FIG. 1, the movable portion 13 and the movable electrodes 14 are connected to the beam 12 that is easily displaced in an x direction but hardly displaced in a y direction. When an acceleration in the x direction is applied, a displacement amount x represented by the following Equation (1) is generated from a relation of F=m·a=kx. Note that F is force, m is masses of the movable portion 13 and the movable electrodes 14, k is a spring constant of the beam 12, and a is an applied acceleration.

$$x=(m/k)\cdot a \quad (1)$$

With this displacement, the distance between the movable electrode 14 and the fixed electrode 15 is varied, and the capacitance is changed. By detecting the capacitance change proportional to the applied acceleration, the applied acceleration can be measured.

Figure 3:
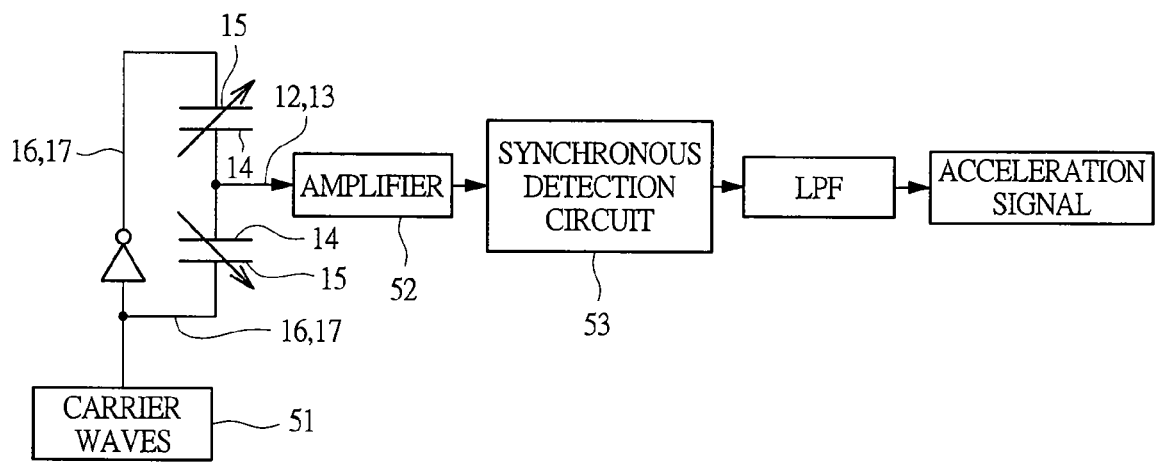
FIG. 3 shows a detection circuit for extracting an acceleration signal from a change in capacitance.

FIG. 3 shows a detection circuit for extracting an acceleration signal from the capacitance change. Note that, in FIG. 3, the movable electrode 14 and the fixed electrode 15 are represented as capacitors, and the beam 12, the movable portion 13, the movable electrode 14, the fixed electrode 15, the terminal portion 16 and the electrode pad 17 are represented as wirings. The same reference numerals are provided as an equivalent circuit in FIG. 3.

Carrier waves 51 that differ in phase by 180 degrees are applied to each of the fixed electrodes 15, and a difference therebetween is amplified by an amplifier 52 and is then subjected to synchronous detection by a synchronous detection circuit 53, thereby outputting a voltage signal proportional to the applied acceleration. Further, it has been known that an electrode that cancels out the force F generated by the applied acceleration by means of a re-balance force generated by an electrostatic force is provided to the movable portion 13 and a voltage to be applied to this electrode is monitored, thereby detecting the applied acceleration.

Figure 4:
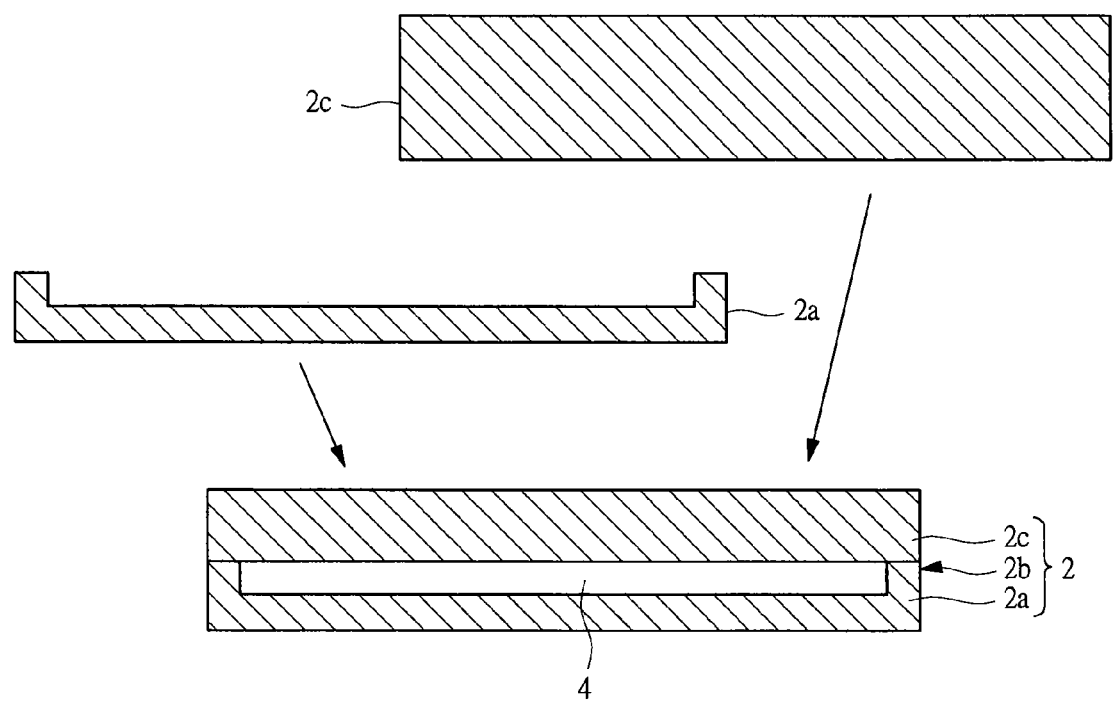
FIG. 4 is a cross-sectional view of a MEMS device during a manufacturing process according to the embodiment of the present invention.
Figure 11:
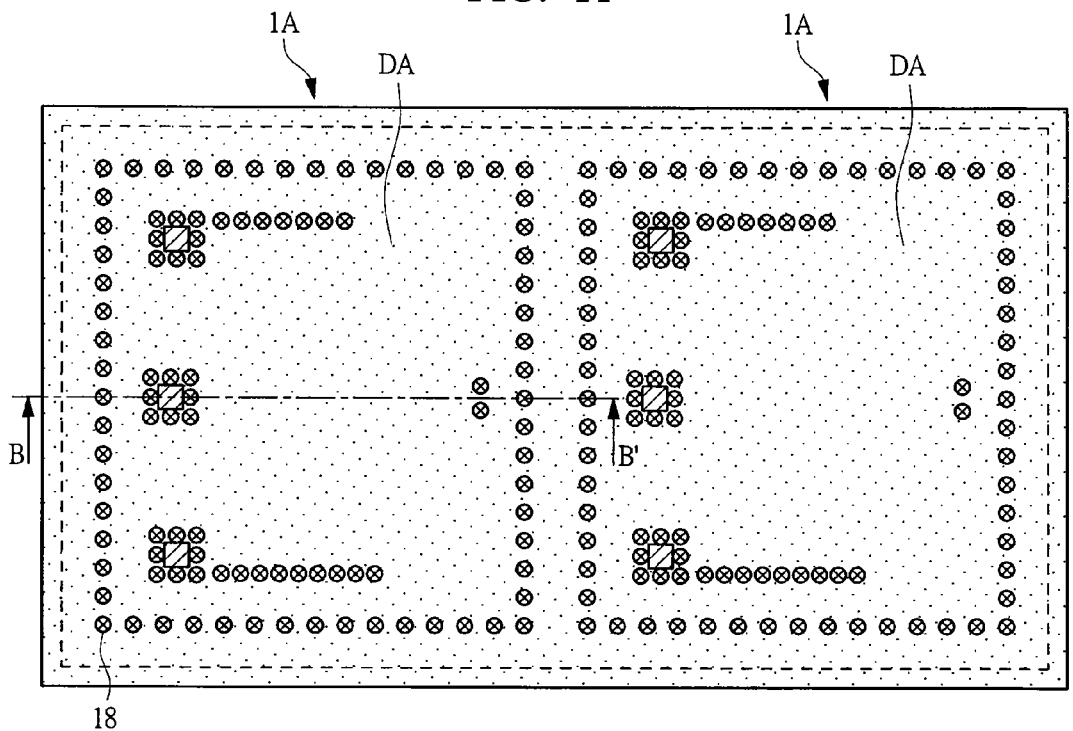
FIG. 11 is a plan view of the MEMS device during the manufacturing process according to the embodiment of the present invention.
Figure 12:
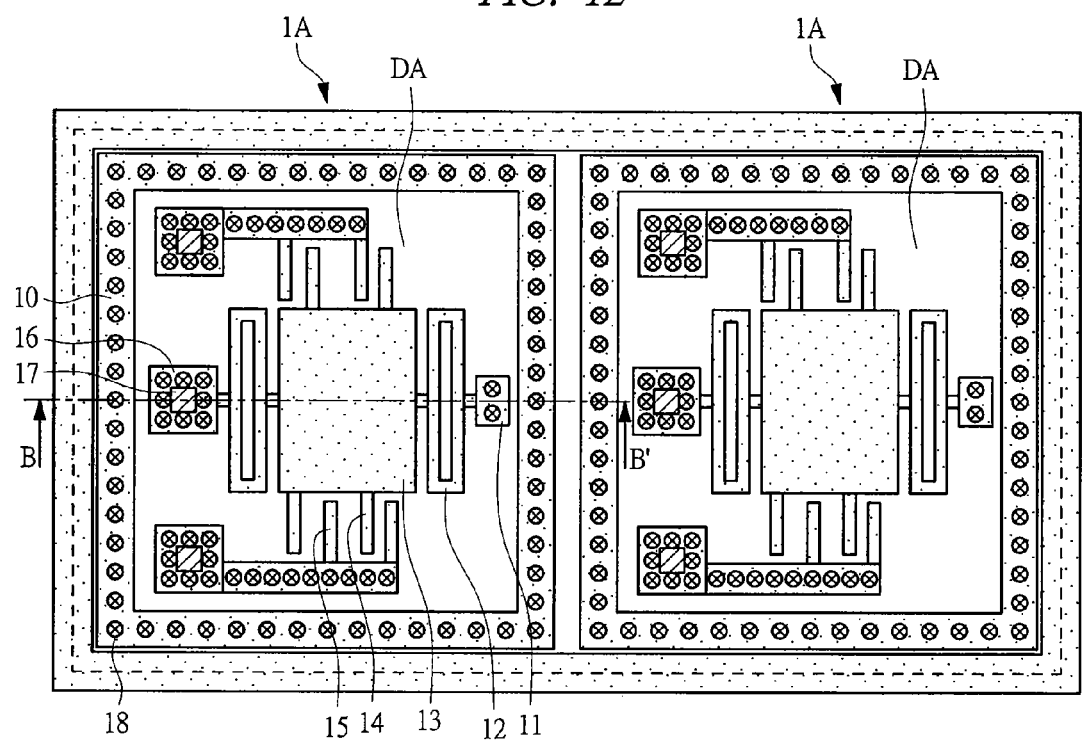
FIG. 12 is a cross-sectional view of the MEMS device during the manufacturing process continued from FIG. 11.
Figure 13:
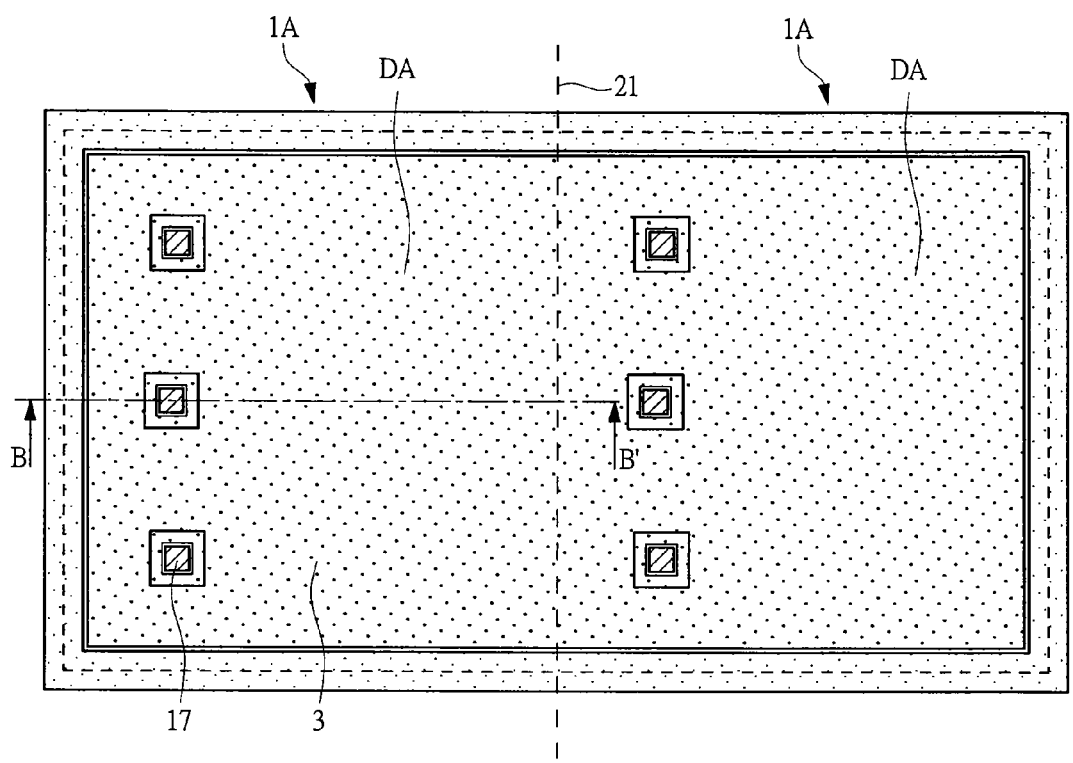
FIG. 13 is a cross-sectional view of the MEMS device during the manufacturing process continued from FIG. 12.
Figure 14:
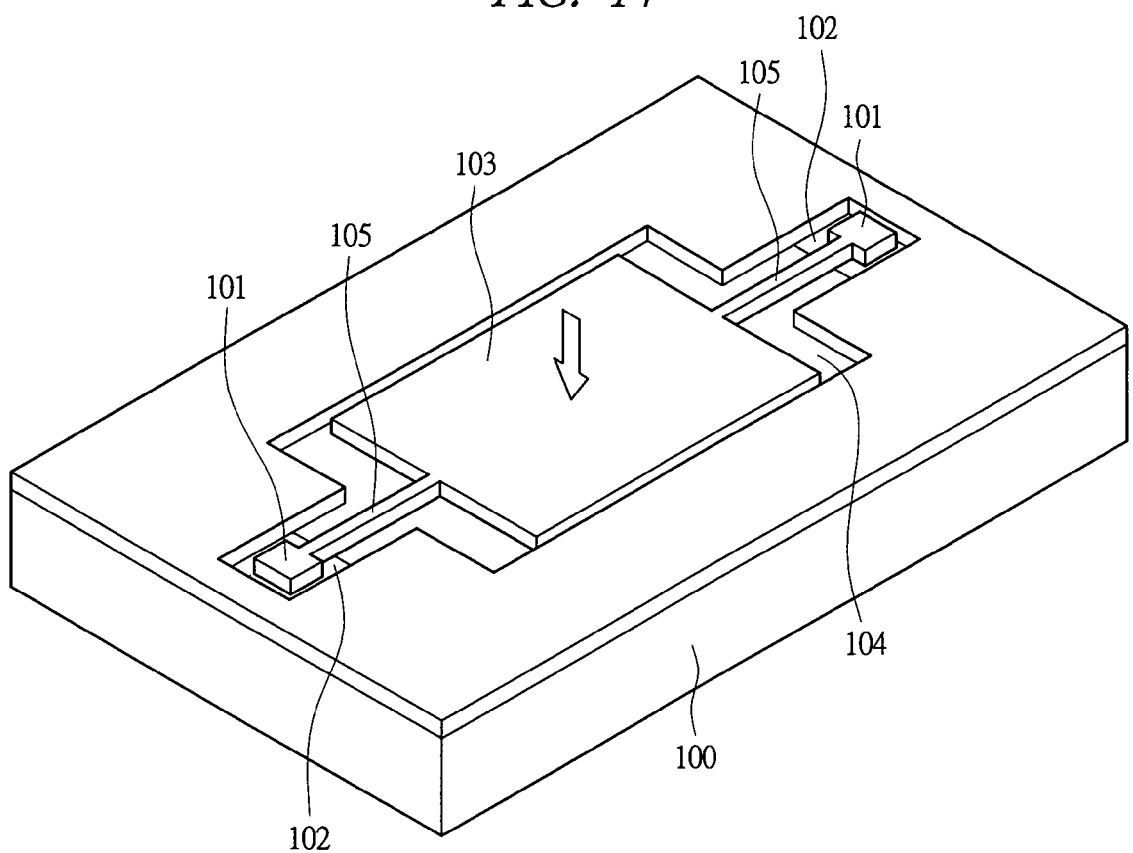
FIG. 14 is a perspective view of the configuration of a MEMS device studied by the inventors of the present invention.

Next, a method of manufacturing the acceleration sensor 1A according to the present embodiment will be described with reference to FIG. 4 to FIG. 13. FIG. 4 is a cross-sectional view of a substrate having a space in a wafer state during a manufacturing process. FIG. 5 to FIG. 10 are cross-sectional views of main parts of the MEMS device during the manufacturing process. FIG. 11 to FIG. 13 are plan views of the main parts of the MEMS device during the manufacturing process. Note that FIG. 5 to FIG. 10 show the cross sections taken along the line B-B' in FIG. 11 to FIG. 13.

First, as shown in FIG. 4, the substrate 2 having the supporting substrate 2a to be a supporting member and the device layer 2c formed of a conductor provided with interposing the space 4 (space layer 2b) between the supporting substrate 2a and the device layer 2c is prepared. Specifically, a first silicon substrate constituting the supporting substrate 2a and a conductive second silicon substrate constituting the device layer 2c are prepared. Note that, though not shown in FIG. 4, as described with reference to FIG. 2, the substrate 2 has the area A1 included in the device formation area DA and having the movable portion 13 formed therein, the area A2 in contact with the area A1 and having components such as the fixing portion 11 and the terminal portion 16 fixed to the supporting substrate 2a formed therein, and the area A3 surrounding the device formation area DA and having the base 10 formed therein.

Next, a concave portion is formed at a center portion of the supporting substrate 2a by using photolithography and etching, and then the first silicon substrate and the second silicon substrate are stacked and bonded to each other by normal-temperature bonding method. By this means, the space 4 constituted of the concave portion is formed between the supporting substrate 2a formed of the first silicon substrate and the device layer 2c formed of the second silicon substrate. Thereafter, the thickness of the device layer 2c is adjusted by polishing or dry etching using $SF_6$ gas. In this manner, the substrate 2 having the space layer 2b in which the space 4 is formed between the silicon substrates can be prepared.

Here, since the first silicon substrate for use as the supporting substrate 2a is also used as a simple supporting substrate, it is not necessarily made of silicon, but a glass or metal plate may be used. Also, the second silicon substrate for use as the device layer 2c is not particularly limited as long as it is a conductive film such as a metal plate. Specifically, the supporting member to be the supporting substrate 2a may be made of silicon, glass or metal, and the conductor constituting the device layer 2c may be made of conductive silicon or metal. In this case, the conductor and the supporting member are stacked and bonded to each other by silicon-silicon bonding, silicon-metal bonding, silicon-glass bonding, glass-metal bonding or metal-metal bonding, thereby forming the substrate 2 having the space 4.

Figure 5:
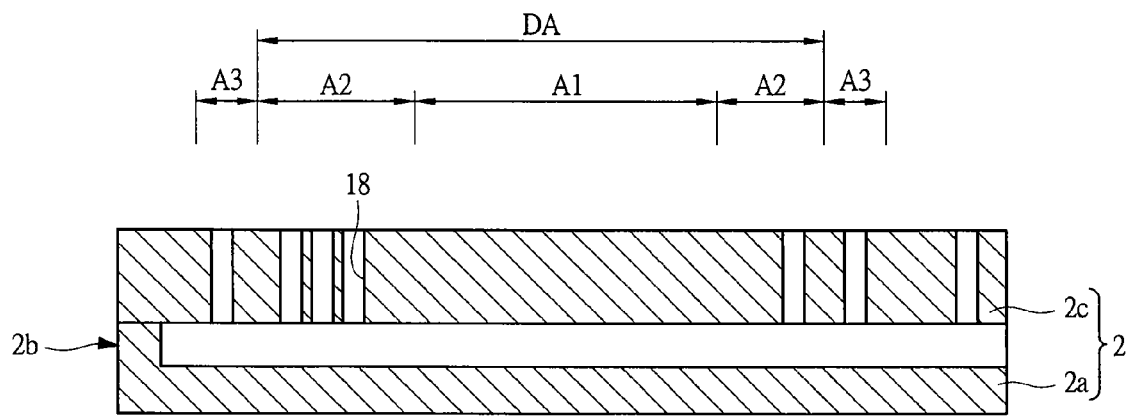
FIG. 5 is a cross-sectional view of the MEMS device during the manufacturing process continued from FIG. 4.

Subsequently, the processes of forming the holes 18, filling the fixing material 19 and forming the electrode pad 17 will be described. As shown in FIG. 5, by using photolithography and etching to the device layer 2c, the micro-holes 18 penetrating in a thickness direction of the substrate 2 are formed in the areas A2 and A3 of the device layer 2c. These holes 18 are filled with the fixing material 19, so that fixed components such as the base 10, the fixing portion 11, the fixed electrodes 15, and the terminal portion 16 that are formed in latter processes are fixed to the supporting substrate 2a via the space layer 2b. Therefore, the holes 18 are formed so as to penetrate through the device layer 2c in accordance with the shape and position of each component to be fixed to the supporting substrate 2a such as the base 10 and the fixing portion 11. Also, since the fixing material 19 has to reach the supporting substrate 2a for fixation, the diameter of each hole 18 is preferably equal to or twice as large as the thickness of the space layer 2b.

Figure 6:
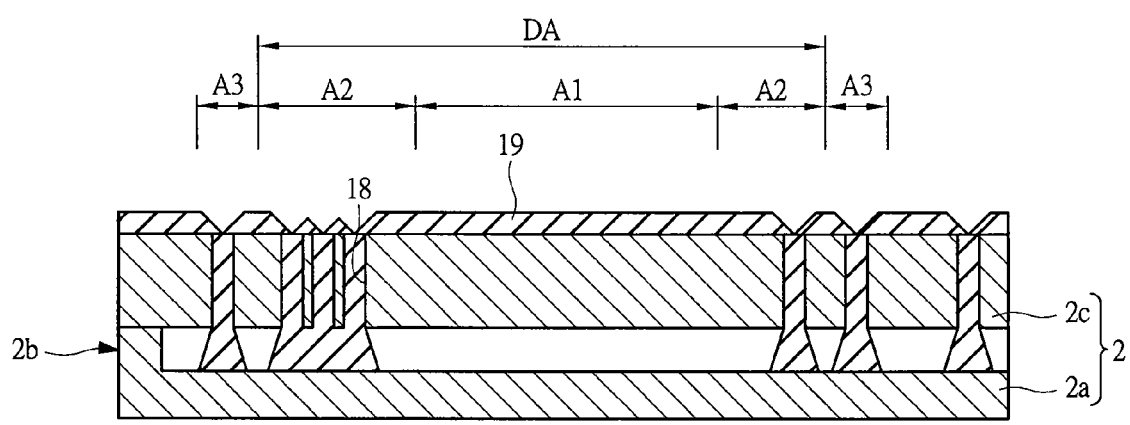
FIG. 6 is a cross-sectional view of the MEMS device during the manufacturing process continued from FIG. 5.

Next, as shown in FIG. 6, the fixing material 19 is provided through the holes 18 to be deposited on the supporting substrate 2a. Furthermore, the holes 18 are filled with the fixing material 19, thereby fixing the supporting substrate 2a and the device layer 2c in the areas A2 and A3 with the fixing material 19. Specifically, the holes 18 are filled with the fixing material 19 by using a film formation method such as Chemical Vapor Deposition (CVD), and a portion of the device layer 2c surrounding a portion where the holes 18 are formed is fixed to the supporting substrate 2a.

It is also possible to form a wall of the fixing material 19 between the device layer 2c and the supporting substrate 2a by appropriately considering the shape, interval and size of each hole 18. For example, a film of the fixing material 19 formed below the base 10 has not only the function to fix the base 10 to the supporting substrate 2a but also the function to form a hermetic device formation area DA (refer to FIG. 2) by forming a wall between the device layer 2c and the supporting substrate 2a.

Figure 7:
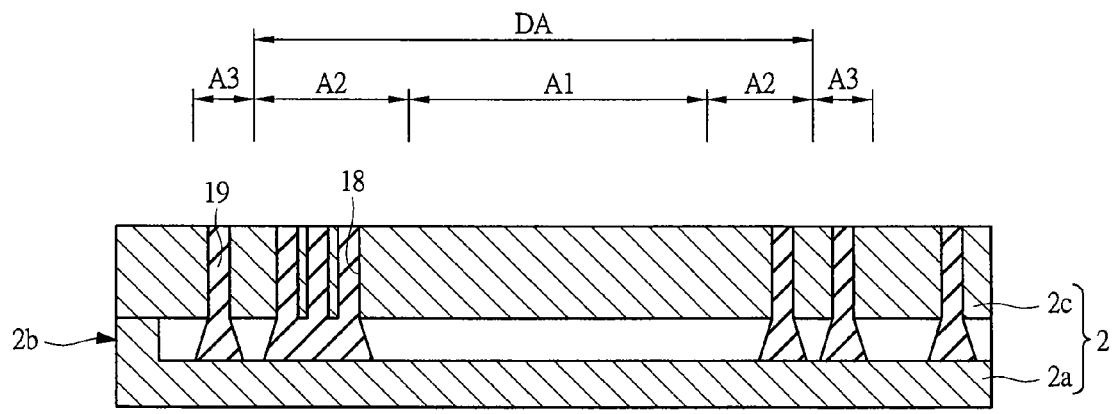
FIG. 7 is a cross-sectional view of the MEMS device during the manufacturing process continued from FIG. 6.

Next, as shown in FIG. 7, superfluous portions of the fixing material 19 deposited on the device layer 2c are removed by using Chemical Mechanical Polishing (CMP).

Figure 8:
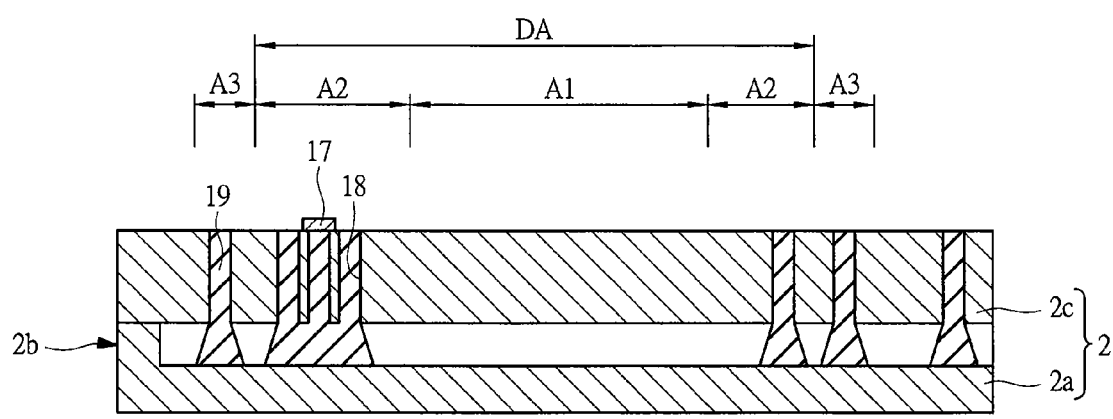
FIG. 8 is a cross-sectional view of the MEMS device during the manufacturing process continued from FIG. 7.

Next, as shown in FIG. 8 and FIG. 11, after forming a conductive metal film made of Al on the device layer 2c by using a film forming method such as sputtering, the electrode pad 17 is formed by patterning the metal conductive film by using photolithography and etching.

Figure 9:
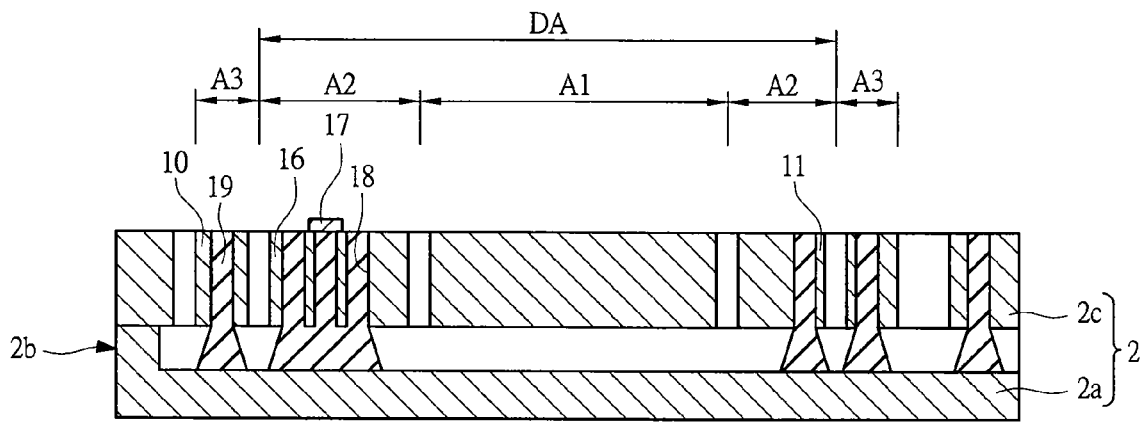
FIG. 9 is a cross-sectional view of the MEMS device during the manufacturing process continued from FIG. 8.

Next, as shown in FIG. 9 and FIG. 12, the device layer 2c is patterned by using photolithography and etching, thereby forming the base 10 in which the supporting substrate 2a and the device layer 2c in the area A3 are fixed together. Also, the fixing portion 11 and the terminal portion 16 in which the supporting substrate 2a and the device layer 2c in the area A2 are fixed together and the beam 12 with one end connected to the fixing portion 11 are formed in the same manner. Furthermore, the movable portion 13 connected to the other end of the beam 12 is formed from the device layer 2c in the area A1.

The base 10 is formed in a closed-curve shape in the device layer 2c so as to surround the device formation area DA. Since the cap 3 formed in a latter process is bonded to the base 10 to form a hermetically-sealed space (device formation area DA), the base 10 has to be firmly adhered to the supporting substrate 2a, and the space layer 2b below the base 10 has to be filled. For this purpose, the holes 18 are densely formed in this base 10, and the fixing material 19 is formed in the space layer 2b below the base 10 so as to be a wall. The base 10 is formed by etching the portion around these holes 18 into a band shape so as to penetrate through the device layer 2c.

Also, the fixing portion 11 is a portion fixed to the supporting substrate 2a to suspend the movable portion 13 on the beam 12 or the like formed together. Similar to the base 10, the fixing portion 11 is fixed by filling the holes 18 formed in advance with the fixing material 19 so that the fixing material 19 reaches the supporting substrate 2a. The fixing portion 11 is formed by removing the device layer 2c around these holes 18 by etching.

Similar to the base 10, the fixing portion 11 and others, the beam 12 is formed by removing the device layer 2c around the beam 12 by etching. This beam 12 is connected to the fixing portion 11 and movably supports the movable portion 13 and the movable electrodes 14.

Similar to the base 10, the fixing portion 11, the beam 12 and others, the movable portion 13 is formed by removing the surrounding device layer 2c by etching. This movable portion 13 is connected to the beam 12, works as the mass of the acceleration sensor 1A, and is displaced in proportion to the acceleration when applied.

Similar to the base 10, the fixing portion 11, the beam 12 and the movable portion 13, the movable electrodes 14 are formed by removing the surrounding device layer 2c by etching. These movable electrodes 14 are connected to the movable portion 13 and move in the same manner as that of the movable portion 13.

Similar to the base 10, the fixing portion 11, the beam 12, the movable portion 13 and the movable electrodes 14, the fixed electrodes 15 are formed by removing the surrounding device layer 2c by etching. Similar to the base 10 and the fixing portion 11, these fixed electrodes 15 are fixed by filling the holes 18 formed in advance with the fixing material 19 so that the fixing material 19 reaches the supporting substrate 2a.

Similar to the base 10, the fixing portion 11, the beam 12, the movable portion 13, the movable electrodes 14 and the fixed electrodes 15, the terminal portion 16 is formed by removing the surrounding device layer 2c by etching. Similar to the base 10, the fixing portion 11 and the fixed electrodes 15, the terminal portion 16 is fixed by filling the holes 18 formed in advance with the fixing material 19 so that the fixing material 19 reaches the supporting substrate 2a. Also, the terminal portion 16 is connected to the fixed electrodes 15, and the electrode pad 17 is formed in advance on the terminal portion 16.

Figure 10:
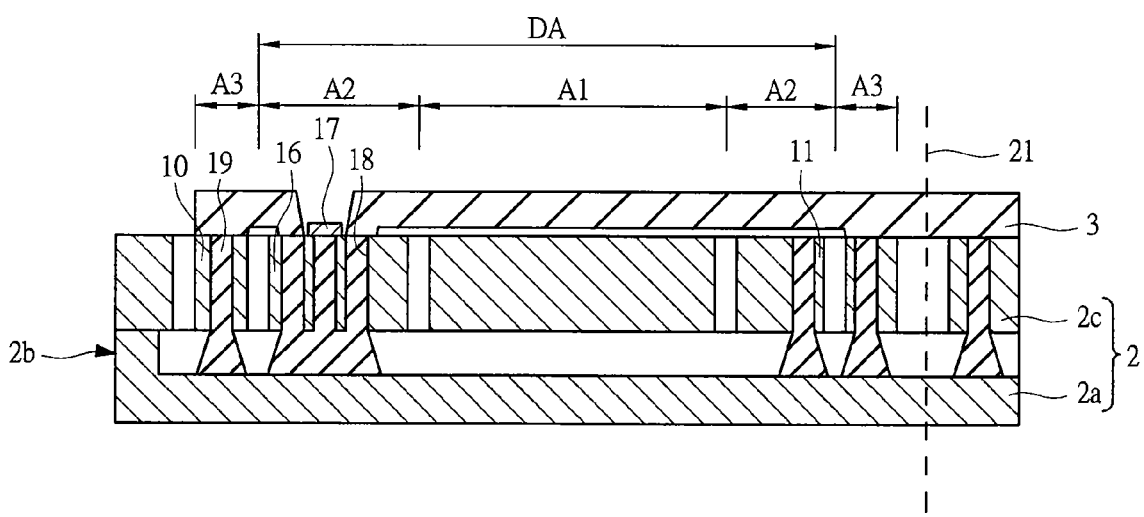
FIG. 10 is a cross-sectional view of the MEMS device during the manufacturing process continued from FIG. 9.

Next, as shown in FIG. 10 and FIG. 13, the cap 3 having openings formed in advance is bonded onto the base 10, and the electrode pads 17 are exposed through these openings. This cap 3 is formed so as to cover the device formation area DA, and the device formation area DA in which the structure of the acceleration sensor is formed is hermetically sealed with the cap 3. Also, the hermetically-sealed movable electrodes 14 and fixed electrodes 15 are electrically connected to the outside via the electrode pad 17. Therefore, it is possible to exchange electric signals with the outside.

In the present embodiment, a glass substrate is used as the cap 3. Alternatively, another substrate made of different insulator such as an insulating silicon substrate may be used. Further, with respect to a bonding method, an example in which the cap 3 and the base 10 are anodically bonded has been described. Alternatively, the cap 3 and the base 10 may be bonded with normal-temperature bonding using the surface activation by plasma or ions or may be bonded with an adhesive such as glass frit or solder.

In particular, when an insulating silicon substrate is used as the cap 3, the cap 3 and the base 10 can be bonded with normal-temperature bonding. At this time, since the cap 3 and the base 10 are made of the same material, sealing distortion due to a difference in a temperature coefficient of expansion between sealing materials can be eliminated, and thus a high-performance angular velocity detection device can be obtained.

Next, the substrate 2 bonded to the cap 3 is diced along a dicing line 21, thereby obtaining the pieces of the acceleration sensor 1A. In this manner, the acceleration sensor 1A according to the present embodiment can be formed.

In the present embodiment, an acceleration sensor is described as an example of the MEMS device. However, the gist of the present invention is not restricted to the acceleration sensor, but is directed to a technology effective in a structure such as an angular velocity sensor or a resonator, in which the structure of the device layer 2c is suspended on the supporting substrate 2a. In particular, when the present invention is used for a micromirror device, a smooth and large area to be a mirror can be released without forming etch holes.

Also, in the present embodiment, description has been made by using the wafer (substrate 2) having the space 4 shown in FIG. 4. Alternatively, it is also possible to use a wafer having the space 4 fabricated through any of the manufacturing methods disclosed in the Non-Patent Documents 1 and 2.

Specifically, after a silicon wafer (silicon substrate) with a front surface and a rear surface is prepared, a plurality of trenches (holes) on the order of sub-microns are formed on a front surface or rear surface side. Then, the silicon substrate is subjected to hydrogen-annealing to link the plurality of trenches together, thereby forming the space 4. In this manner, the substrate 2 in which the supporting substrate 2a (supporting member) and the device layer 2c (conductor) are formed of the silicon substrate can be formed.

Further, after a silicon wafer (silicon substrate) with a front surface and a rear surface is prepared, a silicon oxide film is formed on the front surface, and a conductive polycrystalline silicon film is formed on the silicon oxide film. Next, after a plurality of trenches (holes) reaching the silicon oxide film are formed in the polycrystalline silicon film, the silicon substrate is subjected to hydrofluoric acid treatment, thereby removing the silicon oxide film below the plurality of trenches to form the space 4. In this manner, the substrate 2 in which the supporting substrate 2a (supporting member) is formed of the silicon substrate and the device layer 2c (conductor) is formed of the conductive polycrystalline silicon film can be formed.

Still further, the structure of the substrate 2 shown in FIG. 1 and FIG. 2 can be formed in the following manner. First, a first silicon substrate to be the supporting substrate 2a (supporting member) and a conductive second silicon substrate constituting the device layer 2c (conductor) are prepared. Next, a convex portion is formed on the first silicon substrate. This convex portion corresponds to the wall formed of the fixing material 19 in the space layer 2b described above, and is formed of the first silicon substrate. Next, by the use of the normal-temperature bonding method, the first silicon substrate and the second silicon substrate are fixed together at the convex portion, thereby forming the space 4 between the first silicon substrate and the second silicon substrate. Thus, the holes 18 in the device layer 2c described above are not formed, and the device layer 2c is formed of the second silicon substrate. Next, the device layer 2c is patterned, thereby forming a fixing portion where the first silicon substrate and the second silicon substrate are fixed together, a beam with one end connected to the fixing portion, and a movable portion connected to the other end of the beam. In this manner, the structure of the substrate 2 shown in FIG. 1 and FIG. 2 is completed. Note that, as described above, the supporting substrate 2a may be made of not only silicon but also glass or metal, and the device layer 2c may be made of not only conductive silicon but also metal.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, although the case where the present invention is applied to an acceleration sensor has been described in the above-described embodiment, the present invention can be applied to an inertial-force detection sensor such as an angular velocity sensor and vibrating MEMS devices such as a resonator, a mechanical filter and a micromirror.

The present invention can be widely used for the manufacturing industry of MEMS devices.

What is claimed is:

1. A method of manufacturing a MEMS device comprising the steps of:
   (a) preparing a substrate that includes a supporting member and a conductor provided with interposing a space between the conductor and the supporting member and that has a first planar area and a second planar area in contact with the first planar area;
   (b) after the step (a), forming a hole in the conductor in the second planar area, the hole penetrating in a thickness direction of the substrate;
   (c) after the step (b), providing a fixing material through the hole to be deposited on the supporting member and further filling the hole with the fixing material, thereby fixing the supporting member and the conductor in the second planar area with the fixing material; and
   (d) after the step (c), patterning the conductor, thereby forming a fixing portion from the conductor in the second planar area and forming a movable portion and a beam from the conductor in the first planar area, the beam connecting the movable portion and the fixing portion,
   wherein the substrate has a third planar area surrounding the first planar area and the second planar area,
   in the step (b), a hole penetrating in a thickness direction of the substrate is formed in the conductor in the third planar area,
   in the step (c), in the third planar area, the fixing material is provided through the hole to be deposited on the supporting member, and further the hole is filled with the fixing material, thereby fixing the supporting member and the conductor in the third planar area with the fixing material,
   in the step (d), a base is formed from the conductor in the third planar area, and
   the method further comprises, after the step (d), a step (e) of bonding a cap onto the base, the cap covering the first planar area and the second planar area.

2. A method of manufacturing a MEMS device comprising the steps of:
   (a) preparing a substrate that includes a supporting member and a conductor provided with interposing a space between the conductor and the supporting member and that has a first planar area and a second planar area in contact with the first planar area;
   (b) after the step (a), forming a hole in the conductor in the second planar area, the hole penetrating in a thickness direction of the substrate;
   (c) after the step (b), providing a fixing material through the hole to be deposited on the supporting member and further filling the hole with the fixing material, thereby fixing the supporting member and the conductor in the second planar area with the fixing material; and
   (d) after the step (c), patterning the conductor, thereby forming a fixing portion from the conductor in the second planar area and forming a movable portion and a beam from the conductor in the first planar area, the beam connecting the movable portion and the fixing portion,
   wherein the substrate has a third planar area surrounding the first planar area and the second planar area,
   in the step (b), holes penetrating in a thickness direction of the substrate are formed at predetermined intervals in the conductor in the third planar area,
   in the step (c), in the third planar area, the fixing material is provided through the holes so that the fixing material is deposited on the supporting member, and further the holes are filled with the fixing material, thereby forming a wall in the space, the wall reaching the conductor from the supporting member, and fixing the supporting member and the conductor in the third planar area with the fixing material,
   in the step (d), a base is formed from the conductor in the third planar area, and
   the method further comprises, after the step (d), a step (e) of bonding a cap onto the base, the cap covering the first planar area and the second planar area, thereby hermetically-sealing the space defined by the cap, the supporting member, and the wall.

3. The method of manufacturing a MEMS device according to claim 2,
   wherein the conductor is made of silicon,
   the cap is made of glass, and
   in the step (e), the base formed of the conductor and the cap are fixed together by silicon-glass bonding.

4. The method of manufacturing a MEMS device according to claim 2,
wherein the conductor is made of silicon,
the cap is made of silicon, and
in the step (e), the base formed of the conductor and the cap are bonded together by silicon-silicon bonding.

5. The method of manufacturing a MEMS device according to claim 2,
wherein an opening is formed in the cap, and
after the step (c), an electrode pad is formed on the fixing portion, and in the step (e), the electrode pad is exposed through the opening.

* * * * *